United States Patent
Shiga et al.

(10) Patent No.: US 7,161,850 B2
(45) Date of Patent: Jan. 9, 2007

(54) NAND FLASH MEMORY AND BLANK PAGE SEARCH METHOD THEREFOR

(75) Inventors: Hitoshi Shiga, Yokohama (JP); Chih-Hung Wang, Jubei (TW); Chin Hsi Lin, Jubei (TW)

(73) Assignees: Kabushiki Kaisha Toshiba, Tokyo (JP); Solid State System Co., Ltd., Jubei (TW)

( * ) Notice: Subject to any disclaimer, the term of this patent is extended or adjusted under 35 U.S.C. 154(b) by 0 days.

(21) Appl. No.: 11/292,347

(22) Filed: Dec. 2, 2005

(65) Prior Publication Data

US 2006/0083065 A1    Apr. 20, 2006

Related U.S. Application Data

(62) Division of application No. 10/958,331, filed on Oct. 6, 2004, now Pat. No. 7,085,160.

(30) Foreign Application Priority Data

Jun. 10, 2004  (JP)  ............................. 2004-172896

(51) Int. Cl.
*G11C 7/10* (2006.01)

(52) U.S. Cl. .............................. 365/189.05; 365/189.09
(58) Field of Classification Search ........... 365/189.05, 365/189.09, 189.01
See application file for complete search history.

(56) References Cited

U.S. PATENT DOCUMENTS

| 5,418,737 A * | 5/1995 | Tran ............................. 365/63 |
| 5,610,859 A | 3/1997 | Nakamura et al. |
| 5,761,122 A | 6/1998 | Nakamura et al. |
| 6,282,121 B1 | 8/2001 | Cho et al. |
| 6,646,930 B1 | 11/2003 | Takeuchi et al. |

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes a memory cell array, data buffer, and column switch. The data buffer senses the potential of a bit line to determine data in a selected memory cell and hold readout data in a read. The data buffer detects both whether the whole data buffer holds "0" data and whether the whole data buffer holds "1" data. The column switch selects part of the data buffer and connects the part to a bus.

4 Claims, 5 Drawing Sheets

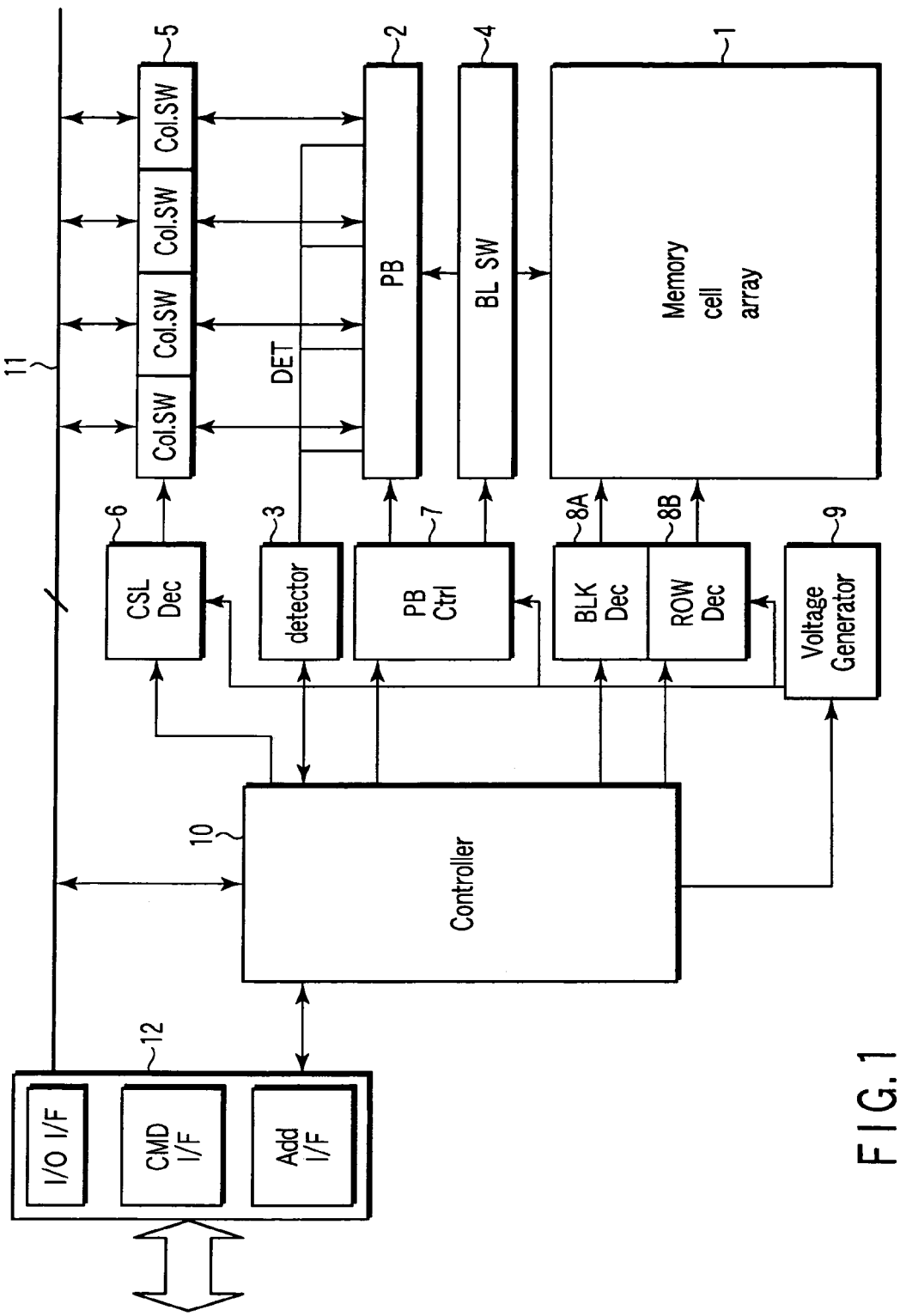
F I G. 1

NAND FLASH MEMORY AND BLANK PAGE SEARCH METHOD THEREFOR

CROSS-REFERENCE TO RELATED APPLICATIONS

This application is a divisional of and claims priority under 35 U.S.C. §120 to U.S. application Ser. No. 10/958,331, filed Oct. 6, 2004 now U.S. Pat. No. 7,085,160, and is based upon and claims the benefit of priority from prior Japanese Patent Application No. 2004-172896, filed Jun. 10, 2004, the entire contents of each of which are incorporated herein by reference.

BACKGROUND OF THE INVENTION

1. Field of the Invention

The present invention relates to a semiconductor memory device and a blank page search method therefor and, more particularly, a search method of searching for a page (blank page) in a data initial state in a write in, e.g., a NAND flash memory.

2. Description of the Related Art

In a NAND flash memory, as described in, e.g., U.S. Pat. No. 6,507,508, a plurality of memory cells are connected in series. Each memory cell has, e.g., an n-channel MOSFET structure including a floating gate as a charge accumulation layer and a control gate. Adjacent memory cells share the drain or source. First and second select gate transistors (MOSFETs) are formed between a bit line and one terminal of this series circuit and between its other terminal and a source line, respectively, to form one NAND string. The NAND strings are laid out in an array. The control gates of memory cells of the same row are commonly connected to a word line. The gates of the first and second select gate transistors of the same row are commonly connected to first and second select gate lines, respectively.

A group of NAND strings which share word lines forms a block as an erase unit. In the erase mode, all memory cells in a block are erased. In the read and write modes, one first select gate transistor in a plurality of blocks is selected and rendered conductive to connect series-connected memory cells to a bit line. In this state, a selection voltage is applied to one word line, and a non-selection voltage is applied to the remaining word lines on the same NAND string. A sense amplifier and a write bias circuit (the write bias buffer and a data buffer that holds read and write data are called a page buffer as a whole) are connected to each bit line. The read and write are executed for a unit called a page that shares the selected word line. The size of one page is, e.g., 2,112 bytes. The size of one block is 128 KB.

On the other hand, the host accesses data stored in the memory cells through an IO bus. When the bit width of the IO bus is, e.g., 8 bits (1 byte), the host accesses the page buffer for every byte, like an SRAM.

In the NAND flash memory, the write is executed in the order of page addresses to guarantee the reliability of data stored in the memory cells. For this purpose, the host must search for a page (blank page) in the initial state before a new write.

However, the host can access data only for every byte. To confirm whether a page is a blank page, data of 2,112 bytes must be read out sequentially byte by byte. For this reason, 2,112 clocks are necessary for confirming a blank page.

BRIEF SUMMARY OF THE INVENTION

According to an aspect of the present invention, there is provided a blank page search method for a semiconductor memory device, comprising setting a selection word line voltage to a first level and detecting at once whether all data in two pages are in an erase state, and when it is detected at once that not all the data are in the erase state, setting the selection word line voltage to a second level and detecting at once whether all data in one of the two pages are in the erase state.

According to another aspect of the invention, there is provided a method for search a first blank page of a block in a semiconductor memory device having a detector detecting all "1" of data in a page buffer, comprising calculating an intermediate page address from a start address and an end address, reading a status indicating whether the intermediate page is blank from the semiconductor memory device, and setting the intermediate page to the start page when the status passes, and to the end page when the status fails.

BRIEF DESCRIPTION OF THE SEVERAL VIEWS OF THE DRAWING

FIG. 1 is a block diagram showing the schematic arrangement of a NAND flash memory so as to explain a semiconductor memory device according to the first embodiment of the present invention and a blank page search method therefor;

DETAILED DESCRIPTION OF THE INVENTION

[First Embodiment]

Figure 2:
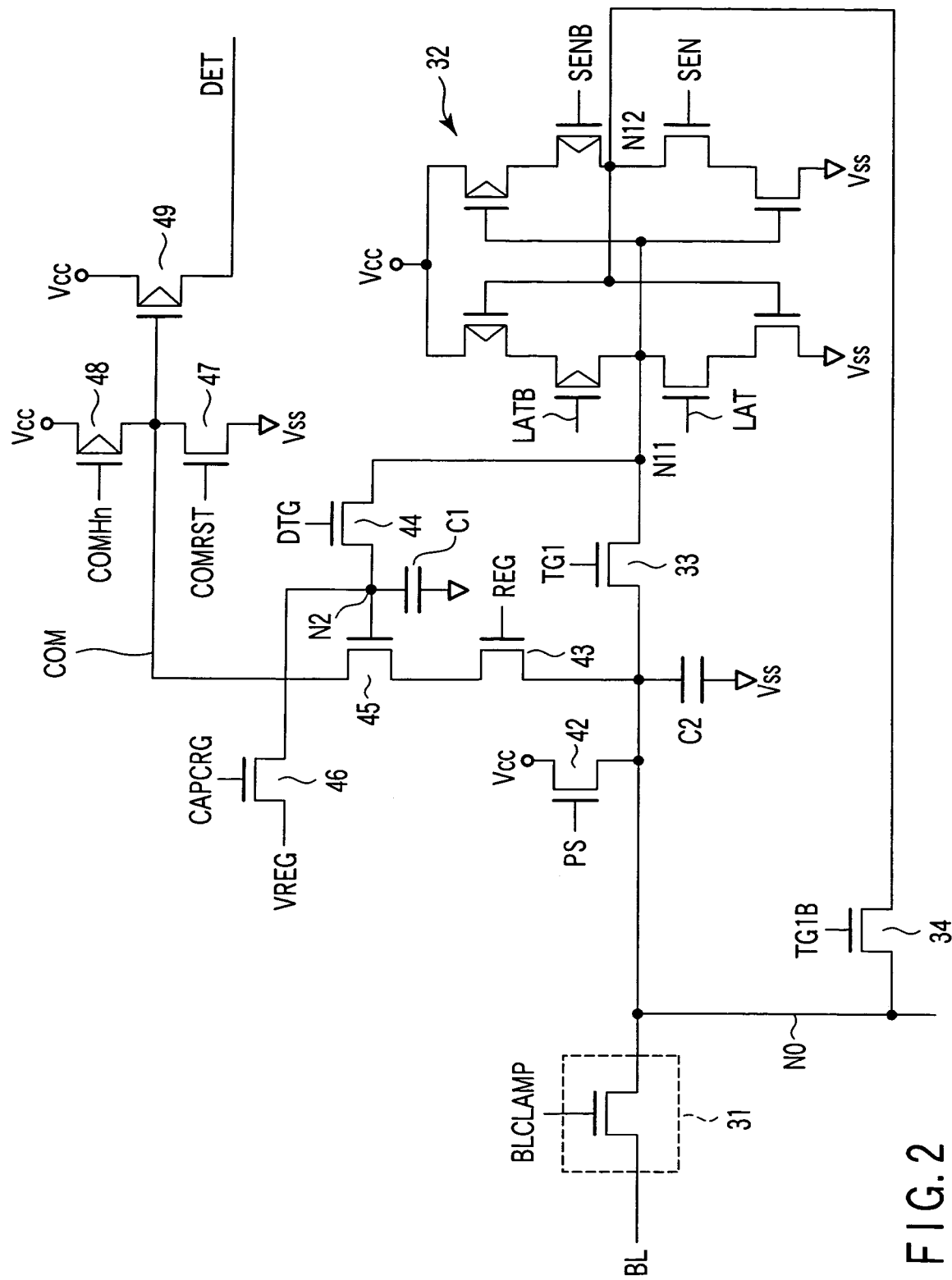
FIG. 2 is a circuit diagram showing a detailed arrangement example of one bit of a page buffer in the circuit shown in FIG. 1.

FIG. 1 is a block diagram showing the schematic arrangement of a NAND flash memory so as to explain a semiconductor memory device according to the first embodiment of the present invention and a blank page search method therefor. In the example to be described in the first embodiment, full page blank check is executed.

A memory cell array 1 in which nonvolatile memory cells are laid out in an array is connected to a page buffer (PB) 2 via a bit line switch (BL SW) 4. The memory cell array 1 is a NAND cell array in which NAND strings are laid out in an array. In each NAND string, a plurality of memory cells having an n-channel MOSFET structure including a floating gate as a charge accumulation layer and a control gate are connected in series. Adjacent memory cells share the drain or source. First and second select gate transistors (MOSFETs) are formed between a bit line and one terminal of this series circuit and between its other terminal and a source line, respectively. The control gates of memory cells of the same row are commonly connected to a word line. The gates of the first and second select gate transistors of the same row are commonly connected to first and second select gate lines, respectively. NAND strings of the same column are connected to a single bit line through a current path of the first select gate transistor. The NAND strings are commonly connected to a source line through a current path of the second select gate transistor.

The page buffer 2 has both the function of a sense amplifier and the function of a data cache. The data cache holds sense data in the read or write data in the write. A column of the page buffer 2, which is designated by a CSL decoder (CSL Dec) 6, is connected to an IO bus 11 through a column switch (Col.SW) 5 so that data input/output can be performed. When the bit width of the IO bus 11 is, e.g., 8 bits, the page buffer 2 transmits/receives data to/from the IO bus 11 byte by byte.

Data transfer between the memory cell array 1 and each-data holding portion in the page buffer 2 and the sense operation by the page buffer 2 are controlled by a page buffer controller (PB Ctrl) 7. A block decoder (BLK Dec) 8A and row decoder (ROW Dec) 8B select a memory cell designated by a page address in the memory cell array 1. A voltage to be applied to each memory cell in the memory cell array 1 or the page buffer 2 is generated by a voltage generator 9. The voltage generated by the voltage generator 9 is also supplies to the CSL decoder 6, page buffer controller 7, block decoder 8A, and row decoder 8B.

The semiconductor memory device (module) is connected to an external device through an interface circuit 12. Various kinds of instructions for the read or write, addresses, and data are exchanged through the interface circuit 12. An address and instruction input through the interface circuit 12 are sent to an internal controller 10. The internal controller 10 has a control circuit which executes various control operations such as read control, write control, and address control. The internal controller 10 controls the voltage generator 9, decoders 8A and 8B, and page buffer controller 7 to control the write/read operation, erase operation, and sense operation.

The page buffer 2 is connected to an all "1" detector 3 through one common line DET. The detector 3 set the common line DET to 0 V. If at least one "0" data is present in the page buffer 2, the common line DET is precharged by a pull-up element arranged in the page buffer 2. Alternatively, the common line DET may be precharges a power supply Vcc by the detector 3 and discharged by a pull-down element arranged in the page buffer 2. The detector 3 executes precharge (or 0-V setting) and level detection for the common line DET and transfers the result status to the internal controller 10.

FIG. 2 shows a detailed arrangement example of one bit extracted from the page buffer 2 in the circuit shown in FIG. 1. This circuit comprises a bit line potential clamp n-channel MOSFET 31, a latch 32 serving as a sense amplifier and data cache, transfer n-channel MOSFETs 33 and 34 to transfer the potential of a bit line BL to the latch 32, n-channel MOS transistors 42 to 47 to execute precharge and level detection of the common line DET in accordance with data held by the latch 32, p-channel MOS transistors 48 and 49, and capacitors C1 and C2.

More specifically, one end of the current path of the MOSFET 31 is connected to the bit line BL. The other end (node N0) of the current path of the MOSFET 31 is connected to one end of the current path of each of the MOSFETs 33 and 34. A signal BLCLAMP is supplied to the gate of the MOSFET 31. A signal TG1 is supplied to the gate of the MOSFET 33. A signal TG1B is supplied to the gate of the MOSFET 34. The other end of the current path of each of the MOSFETs 33 and 34 is connected to a corresponding one of the input and output terminals of the latch 32. The operation of the latch 32 is controlled by complementary sense amplifier enable signals SENB and SEN and complementary latch control signals LATB and LAT.

The current path of the MOSFET 42 is connected between the node N0 and the power supply Vcc. A signal PS is supplied to the gate of the MOSFET 42. The capacitor C2 is connected between the node N0 and a ground point Vss. One end of the current path of the MOSFET 43 is also connected to the node N0. A signal REG is supplied to the gate of the MOSFET 43. One end of the current path of the MOSFET 45 is connected to the other end of the current path of the MOSFET 43. The gate (node N2) of the MOSFET 45 is connected to one end of the current path of the MOSFET 44. The capacitor C1 is connected between the node N2 and the ground point Vss. It eliminates the addition of capacitors C2 and C1, when the nodes N0 and N2 have the large parasitic capacitances. The other end of the current path of the MOSFET 44 is connected to the connection point (node N11) between the MOSFET 33 and the latch 32. A signal DTG is supplied to the gate of the MOSFET 44. One end of the current path of the MOSFET 46 is connected to the node N2. A signal VREG is supplied to the other end of the current path of the MOSFET 46. A signal CAPCRG is supplied to the gate of the MOSFET 46.

The other end (COM line) of the current path of the MOSFET 45 is connected to one end of the current path of each of the MOSFETs 47 and 48 and the gate of the MOSFET 49. The other end of the current path of the MOSFET 47 is connected to the ground point Vss. A signal COMRST is supplied to the gate of the MOSFET 47. The other end of the current path of the MOSFET 48 is connected to the power supply Vcc. A signal COMHn is supplied to the gate of the MOSFET 48. The one end of the current path of the MOSFET 49 is connected to the power supply Vcc, and its other end is connected to the common line DET.

In the above arrangement, data read out from a selected cell through the bit line BL is supplied to the latch 32 through the MOSFETs 31 and 33 or the MOSFETs 31 and 34, sensed, and held. When "1" data is held, the node N11 of the latch 32 is at "L" level (0), and its other node N12 is at "H" level (1). The COM line and MOSFETs 47 and 48 are shared for every byte.

Figure 3:
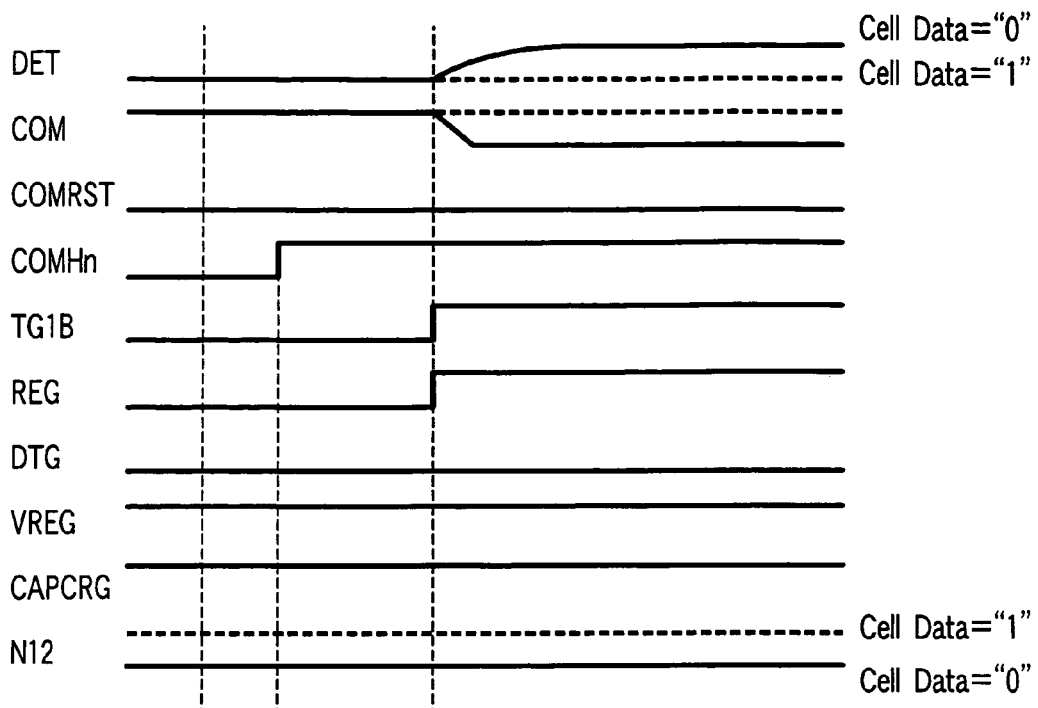
FIG. 3 is a timing chart for explaining the operation of the circuit shown in FIG. 2.

In the above arrangement, as shown in the timing chart in FIG. 3, at time t0, the signal COMRST is set to "L" level, the signal COMHn is set to "L" level, the signal TG1B is set to "L" level, the signal REG is set to "L" level, the signal DTG is set to "L" level, the signal VREG is set to "H" level, and the signal CAPCRG is set to "H" level. Accordingly, the MOSFET 47 is turned off, the MOSFET 48 is turned on, the MOSFET 34 is turned off, the MOSFET 43 is turned off, the MOSFET 44 is turned off, and the MOSFET 46 is turned on. The COM line is precharged by the power supply voltage Vcc. The MOSFET 49 is turned off to set the common line DET to "L" level.

At time t1, the signal COMHn is inverted to "H" level to turn off the MOSFET 48. Then, at time t2, the signal TG1B is inverted to "H" level, and the signal REG is inverted to "H" level to turn on the MOSFETs 34, 43, and 45.

With this operation, the COM line and the node N12 of the latch 32 are electrically connected. When the data in the latch 32 is "0", the node N12 holds "L" level. Hence, the potential of the COM line drops. As a result, the MOSFET 49 is turned on to raise the potential of the common line DET. At this time, if at least one "0" bit is present in the page buffer 2, the potential of the common line DET rises. Conversely, if all data in the page buffer 2 are "1", the potential of the common line DET remains low. When the change in potential of the common line DET is detected by the detector 3 shown in FIG. 1, a blank page that is wholly set in the data initial state (erase state) can quickly be found without reading out the data in the page byte by byte.

The detection function for the initial value of data in the page buffer 2 can be used for, e.g., various application purposes (1) to (3) below.

(1) Program Verify Result Determination

In programming the NAND flash memory, for a bit in which "0" is to be written, the node N11 holds "L" level. For a bit in which "1" is to be written (not to be write-accessed), the node N11 holds "H" level. After verify, for a bit in which "0" is sufficiently written, the node N11 changes to "H" level. For a bit whose write level is not sufficient yet, the node N11 holds "L" level. On the other hand, for a bit in which "1" is written, the node N2 (capacitance node) holds "H" level to turn on the MOSFETs 43 and 45, and the node N11 holds "H" level independently of the read result. In verify determination, not the MOSFET 34 for "1" check but the MOSFET 33 is turned on to electrically connect the COM line to the node N11. If at least one insufficiently written bit is present, the COM line is discharged. This is reflected on the common line DET in the whole page.

(2) Erase Verify Result Determination

Figure 4:
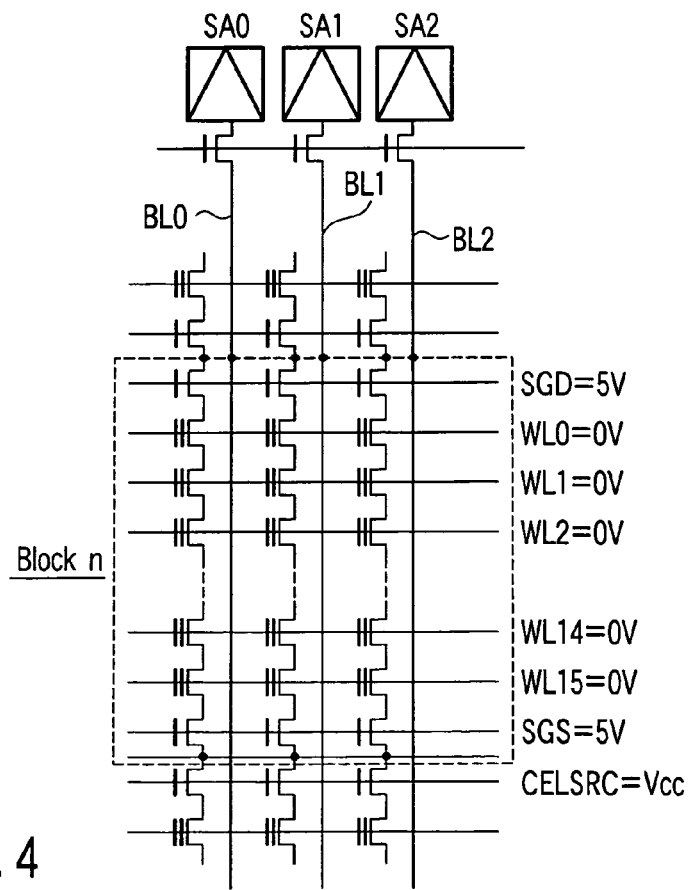
FIG. 4 is a circuit diagram showing the bias states of the terminals of a NAND cell array in an erase verify.

In the erase verify, as shown in FIG. 4, the terminals of erased blocks in the NAND cell array are biased. More specifically, 0 V is applied to all word lines WL0 to WL15, and 5 V is applied to select gate lines SGD and SGS to set the memory cells in the ON state. The power supply voltage Vcc is applied from a source line CELSRC. Bit lines BL0, BL1, BL2, . . . are discharged to 0 V and then connected to sense amplifiers SA0, SA1, SA2, . . . .

When all the memory cells are sufficiently erased, they are set in the ON state even when the word lines WL0 to WL15 have 0 V. For this reason, the bit lines BL0, BL1, BL2, . . . are charged from the source line CELSRC. This is detected by the sense amplifiers SA0, SA1, SA2 . . . .

If erase of all the bits is sufficient, the node N11 in the page buffer 2 changes to "H" level. As in the program verify, when the MOSFET 33 is turned on to electrically connect the node N11 to the COM line, the completion of erase of all the bits can be known by detecting the change in potential of the common line DET.

(3) Read Blank Check

After a page read, the same operation as in the above verify is executed (at this time, the COM line and node N12 are electrically connected). Accordingly, it can be determined whether all the readout data are "1". In the program/erase, the verify result is output as Status "pass/fail". Similarly, when the result of all "1" check is output as a read status, the host side can know whether the page is in the same state as in the data initial state. According to the same logic as in the verify, "pass" indicates the data initial state, and "fail" indicates that data is written on the page.

This read method may be added to a normal read function. In this case, however, the time required for the sequence becomes longer because the determination operation is performed after the page read. To prevent this, this read function may be used as a separate function (command) that is used only when blank check is necessary.

[Second Embodiment]

The second embodiment is a blank page search method in a block using binary search.

Figure 5:
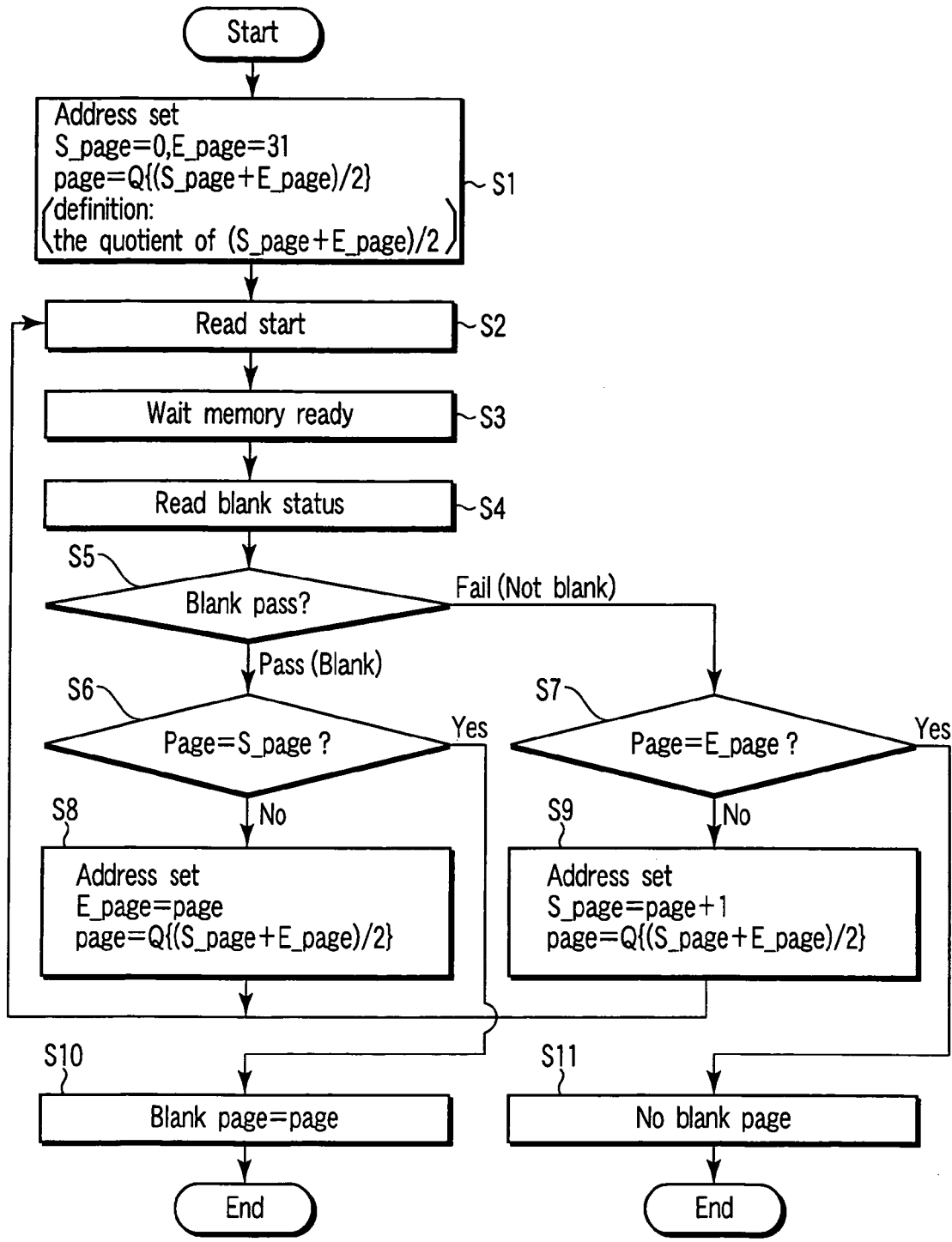
FIG. 5 is a flowchart for explaining a blank page search method for a semiconductor memory device according to the second embodiment of the present invention.

FIG. 5 is a flowchart for explaining a blank page search method for a semiconductor memory device according to the second embodiment of the present invention. A blank page is searched for by using full page blank check described above in the first embodiment. Assume that one block has 32 pages.

In a NAND flash memory, to guarantee the reliability of data stored in the memory cells, the write is executed in the order of page addresses. For this reason, presuming that the write should be executed in the order of addresses, the largest page address where blank check fails is searched for.

First, an address is set (step S1). Assume that the start page is 0 (S_page=0), and the end page is 31 (E_page=31). In this case, the initial page is set at the intermediate (page=Q{(S_page+E_page)/2}) between the start page and the end page.

The read is started from the initial page set in step S1 (step S2).

The processing waits until the memory is ready (step S3). Read blank status is executed (step S4).

Blank check is executed (step S5). When the blank check passes, it is determined whether the (page=S_page?) page is the start page (step S6). Even when the blank check fails, it is determined whether the page (page=E_page?) is the end page (step S7).

If NO in step S6, a new address is set. In this address setting, the checked page is set to the end page (E_page=page), and the initial page is set at the intermediate (page=Q{(S_page+E_page)/2}) between the start page and the newly set end page. The flow returns to step S2 to repeat the same operation as described above. If YES in step S6, the blank page is set to the start page (Blank page=page) (step S10), and the search operation is ended.

Even if NO in step S7, a new address is set. In this address setting, the checked page is set to the start page plus 1 (S_page=page+1), and the initial page is set at the intermediate (page=Q{(S_page+E_page)/2}) between the start page and the set end page. The flow returns to step S2 to repeat the same operation as described above. If YES in step S7, no blank page (No blank page) (step S11), and the search operation is ended.

The above-described search flow itself is well-known blank search.

[Third Embodiment]

The third embodiment is a blank page search method using a bias voltage to a control gate.

Figure 6:
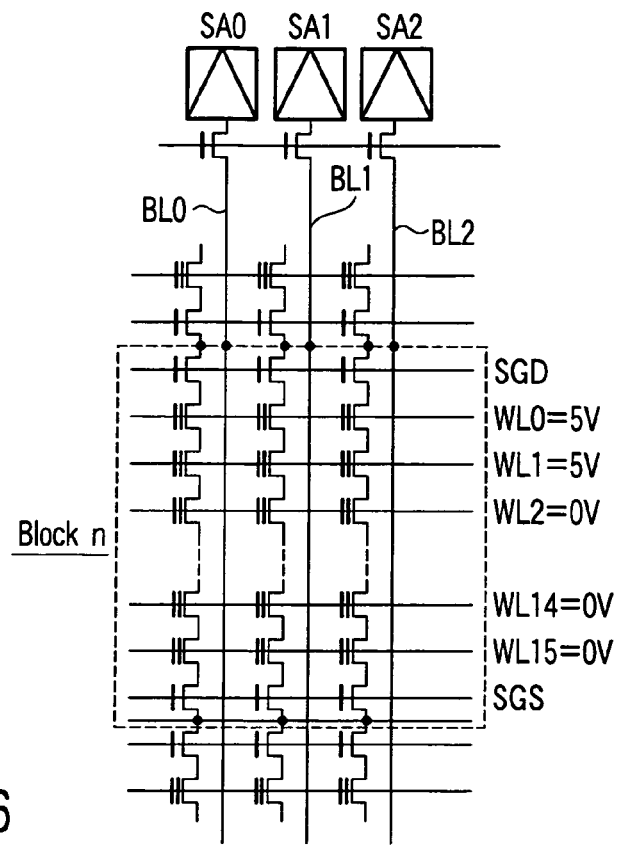
FIG. 6 is a circuit diagram for explaining a modification of the blank page search method for the semiconductor memory device according to the second embodiment of the present invention.

The second embodiment presumes that the write in the memory is executed in the order of pages, and pages after the final data page detected by binary search are always blank. However, as shown in FIG. 6, when a selection bias voltage is applied to all word lines WL2 to WL15 after the selected page (word line WL1), it can be confirmed at once that all pages after the selected page (or all pages before the selected page if the page address order is set from the source side) are blank.

Hence, a blank page that is wholly set in the data initial state (erase state) can more quickly be found without reading out the data in the page for every byte.

[Fourth Embodiment]

The fourth embodiment is a blank page search method (Upper & Lower) for a multilevel memory. Assume that four-value page layout is executed, as shown in FIGS. 7A and 7B.

Figure 7A:
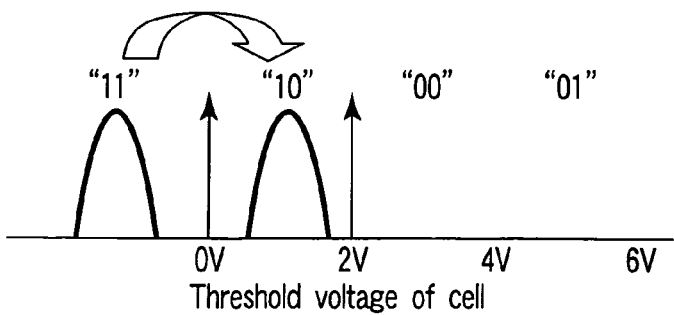
FIGS. 7A and 7B are diagrams showing the relationship between storage data and the threshold voltage of a cell when multilevel page layout is done so as to explain a blank page search method for a semiconductor memory device according to the fourth embodiment of the present invention.
Figure 7B:
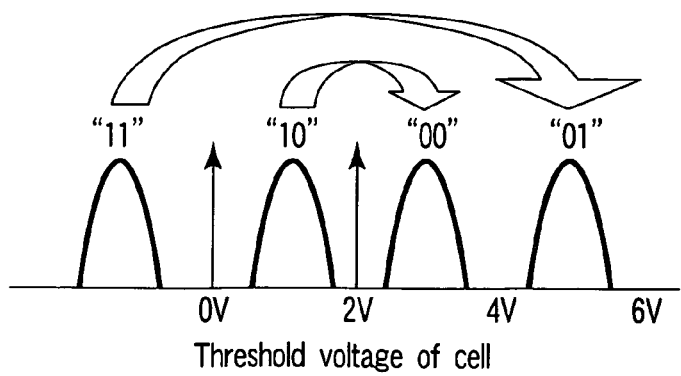

For example, the same memory cells are selected in pages 0 and 1, and "11" and "10" are written in page 0, as shown in FIG. 7A. If data are to be written in page 1 after the data in page 0 are determined, "00" and "11" are written, as indicated by arrows, in accordance with the data in page 0, as shown in FIG. 7B.

In this case, when the potential of the word line is 0 V, and the blank check of the first embodiment passes, both pages 0 and 1 are in the initial state. When this blank check fails, and that when the potential of the word line is 2 V passes, only page 1 is in the initial state.

In this way, the method can also be applied to multilevel page layout.

As described above, according to one aspect of this invention, a semiconductor memory device capable of quickly finding a blank page that is wholly set in the data initial state (erase state) without reading out data in the page byte by byte, and a blank page search method therefor can be obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for searching a first blank page of a block in a semiconductor memory device having a detector detecting all "1" of data in a page buffer, comprising:
   calculating an intermediate page address from a start address and an end address;
   reading a status indicating whether said intermediate page is blank from said semiconductor memory device; and
   setting said intermediate page to said start page when said status passes, and to said end page when said status fails.

2. The method according to claim 1, wherein said detector is connected to said page buffer via a common line, said detector executes potential setting and level detection for said common line and detects all "1" of data in said page buffer.

3. The method according to claim 1, wherein the semiconductor memory device is nonvolatile.

4. The method according to claim 1, wherein a memory cell array of the semiconductor memory device includes a string in which a plurality of adjacent memory cells are connected in series.

* * * * *